United States Patent [19]

Bobal et al.

[11] Patent Number: 5,227,250
[45] Date of Patent: Jul. 13, 1993

[54] GLASS-TO-METAL SEAL

[75] Inventors: Thomas A. Bobal, Robbinsville; Jeffrey M. Arouh, Kendall Park; Sheldon S. Bitko, East Brunswick, all of N.J.

[73] Assignee: Fifth Dimension Inc., Trenton, N.J.

[21] Appl. No.: 763,237

[22] Filed: Sep. 20, 1991

[51] Int. Cl.$^5$ .................. C03C 27/02; H05K 5/06
[52] U.S. Cl. ................... 428/630; 428/670; 428/634; 174/50.61; 65/59.1
[58] Field of Search ............... 428/623, 630, 670, 433, 428/434, 426; 174/50.61; 65/32.2, 59.1, 59.2, 59.23, 59.25, 59.6; 420/463

[56] References Cited

U.S. PATENT DOCUMENTS

| | | | |
|---|---|---|---|
| 1,083,070 | 12/1913 | Eldred | 428/630 |
| 1,166,129 | 12/1915 | Heyl . | |
| 2,106,527 | 1/1938 | Hostetter | 428/670 |
| 2,284,151 | 5/1942 | Kingston . | |
| 2,300,286 | 10/1942 | Gwyn, Jr. . | |
| 2,303,402 | 12/1942 | Sivil . | |
| 2,303,403 | 12/1942 | Sivil . | |
| 2,446,277 | 8/1948 | Gordon . | |
| 2,471,297 | 5/1949 | Atkinson et al. . | |
| 2,478,225 | 8/1949 | Atkinson . | |
| 3,141,753 | 7/1964 | Certa . | |
| 3,160,460 | 12/1964 | Wyzenbeek . | |
| 3,199,967 | 8/1965 | Pixley . | |
| 3,209,103 | 9/1965 | Klammer . | |
| 3,238,700 | 3/1966 | Cohn | 420/463 |
| 3,457,539 | 7/1969 | Lupfer . | |
| 3,467,554 | 9/1969 | Forten et al. . | |
| 3,488,172 | 1/1970 | Aliotta et al. . | |
| 3,637,917 | 1/1972 | Oates . | |
| 3,646,405 | 2/1972 | Wallis et al. . | |
| 3,988,053 | 10/1976 | Dodenhoff . | |
| 4,050,956 | 8/1977 | de Bruin et al. | 65/59.1 |
| 4,099,200 | 7/1978 | Koutalides | 174/50.61 |
| 4,103,416 | 8/1978 | Sakamoto . | |
| 4,128,697 | 12/1978 | Simpson | 174/50.61 |
| 4,277,716 | 7/1981 | Bandks, Jr. . | |
| 4,445,920 | 5/1984 | Smith | 65/32.2 |
| 4,587,144 | 5/1986 | Kellerman et al. | 174/50.61 |
| 4,649,085 | 3/1987 | Landram . | |
| 4,657,337 | 4/1987 | Kyle . | |
| 4,712,085 | 12/1987 | Miki et al. . | |
| 4,737,601 | 4/1988 | Gartzke . | |

OTHER PUBLICATIONS

J. Comer, Applying Glass-to-Metal Seals, Electrical Manufacturing, vol. 62, No. 2, Aug. 1958, pp. 102–107.
E. M. Wise, The Platinum Metals, 1953, pp. 289–296.
J. H. Partridge, Glass to Metal Seals, 1949, pp. 6,7, 11–13, 17, 200.
ASTM B 540-86, "Standard for Palladium Electrical contact Alloy", pp. 365–367 (Mar. 1986).

Primary Examiner—Michael Lewis
Assistant Examiner—Valerie Ann Lund
Attorney, Agent, or Firm—Burns, Doane, Swecker & Mathis

[57] ABSTRACT

A glass-to-metal seal including a metal member such as Pd or a Pd-Ru alloy and a glass member wherein the glass member is in contact with the metal member and forms a glass-to-metal seal therewith. The seal can include an outer body surrounding the glass member and forming a seal therewith. The outer body has a coefficient of thermal expansion greater than that of the glass member and the seals between the outer body, the glass member and metal member are compression seals. The glass-to-metal seal is made by directly glassing onto the metal member in a furnace having an atmosphere which prevents outgassing of hydrogen from the metal member into the interface between the glass member and metal member. After the glass-to-metal seal forming step, the outer body can be metallurgically bonded to another component without chemically cleaning the outer body and the metal member can be metallurgically bonded to another member such as a gold wire without plating the metal member prior to the bonding step.

12 Claims, 1 Drawing Sheet

GLASS-TO-METAL SEAL

BACKGROUND OF THE INVENTION

1. Field of the Invention

The invention relates to the art of glass-to-metal seals. In particular, the invention relates to electrical components which provide (1) hermeticity, (2) acceptably low resistance to current flow, (3) an acceptably high level of insulative resistance, (4) an acceptably high level of resistance to glass corrosion, (5) ease of metallurgical bonding to other components, (6) resistance to thermal and mechanical stresses, (7) glass wetting, (8) an expansion coefficient suitable for glass-to-metal seals, and (9) an economically competitive product.

2. Description of Related Art

Various alloys and metals have been used to form glass-to-metal seals. Such metals include Pt, Cu, Ni, Fe, Mo, W, Ni, etc. For instance, ASTM alloy designation B540 includes 34–36% Pd, 29–31% Ag, 13.5–14.5% Cu, 9.5–10.5% Au, 9.5–10.5% Pt and 0.6–1.2% Zn and has been used to make glass-to-metal seals.

U.S. Pat. Nos. 2,284,151; 2,446,277; 3,141,753; 3,160,460; 3,199,967; 3,209,103; 3,457,539; 3,637,917; 3,646,405; 3,988,053; 4,103,416; 4,277,716; 4,649,085; 4,657,337; 4,712,085; and 4,737,601 disclose examples of glass-to-metal seals. These patents do not disclose or suggest using Pd-Ru alloys to form glass-to-metal seals.

U.S. Pat. Nos. 1,166,129; 2,300,286; 2,303,402; 2,303,403; 2,471,297; 2,478,225; 3,467,554; and 3,488,172 disclose various Pd alloys having noble metal additions such as Ru. These patents do not disclose or suggest using Pd-Ru alloys to form glass-to-metal seals.

In sensitive electronic circuitry, a major problem of conventional glass-to-metal seals is contamination due to introduction of impurities into devices incorporating such glass-to-metal seals. Such impurities can be introduced during chemical cleaning of leads after the glass-to-metal seal is formed. In defense related applications, such impurities can result in failure or malfunction of equipment used for telecommunications, advanced weaponry, guidance systems, etc. Accordingly, there is a need in the art for a glass-to-metal seal which avoids introduction of impurities into sensitive electronic circuitry.

The art of sealing glass-to-metal has been practiced for a very long time. Its purpose, when used in electric components, is to provide a sealed environment which would prevent deterioration of that component if exposed to air or other destructive atmospheres. For example, the leads sealed into the base of an incandescent light bulb allow electric current to heat up the filament (usually tungsten) to incandescence. If air were to penetrate into the light bulb, the filament would immediately burn out.

To be useful as a component of an electric or electronics assembly (tubes, transistors, relays, switches, etc.), the materials of construction have several requirements:

1) Provide hermeticity (a leak rate of $1 \times 10^{-10}$ scc/sec of He under one atmosphere pressure differential would allow a leak of 1/15 of a cubic inch of gas in approximately 300 years). This is a measure of hermeticity and long term component reliability.
2) Provide acceptably low resistance to the flow of current.
3) Provide an acceptably high level of insulative resistance as well as other electrical characteristics between adjacent metal components (i.e., dielectric constant).
4) Provide an acceptably high level of resistance to glass corrosion.
5) Be easily connected into its assembly (i.e., soldering or welding to its mating component).
6) Be capable of withstanding typical thermal and mechanical stresses that it may be exposed to.
7) Be economic to manufacture.
8) The non-glass components should be wettable by the molten glass and have coefficients of expansion suitable for the glass it is used in conjunction with.

Among the first materials used for glass-metal seals to meet those requirements was pure platinum. Although this met a number of the requirements and is still used to some degree, the cost of platinum coupled with its poor wetting to glass resulting in relatively low hermetic capability inhibits its wide spread use. Copper, which can be oxidized and coated to produce a bond to glass, suffers from a coefficient of expansion so high as to severely limit the glasses it can be bonded to. An attempt to overcome this drawback resulted in the development of DUMET (copper clad to Fe-42% Ni alloy) which lowered the expansion coefficient to a useful range.

Those are examples of materials that have been used, and a wide list including molybdenum, tungsten, nickel, etc., have been attempted with various degrees of problems and success.

By far, when used for terminals, the largest quantity of glass-metal seals used today are the following:

1) KOVAR (29% Ni, 17% Co, balance Fe) having a coefficient of expansion of approximately $50 \times 10^{-7}$ in/in/°C. which is in the range of expansion coefficients of the glasses used with it.
2) Ni-Fe alloys (approximately 50% Ni, 50% Fe) having a coefficient of expansion of approximately $100 \times 10^{-7}$ in/in/°C.

While those materials resolve the problem of hermeticity, and most other electrical and mechanical requirements, they introduce a problem of solderability that has plagued the industry for years—namely soldering the component to its mating part. In order to resolve that problem, it is a common practice to chemically clean the material in one or more acid baths, nickel plate and then gold plate the components.

This solution has several drawbacks:

1) Chemicals present in the bath etch are to some degree absorbed into the interstices and pores of the component and are potential contaminants of the device it is intended to protect.
2) If the lead wires are small in diameter, or if there are a lot of leads that can tangle in cleaning or plating, parts must be individually handled, packed, or wired for cleaning and plating. That can be extraordinarily expensive and damaging to fine wire leads.
3) Gold is expensive and introduces problems of its own when soldered to the lead wires (e.g. gold-tin embrittlement).
4) Most importantly, the underlying base material is not usually metallurgically bonded to the layers of plating (typically nickel-iron, nickel plate and copper plate) and solderability problems still abound.

The inventors of the present invention approached these problems with the following considerations in mind. First, any metallic ingredient of the alloy must not have a stable oxide. Second, the metal must be very difficult to oxidize in typical glass sealing processes. Third, the metal must be capable of soldering directly upon emerging from the glass sealing oven without benefit of aqueous cleaning cycles.

The inventors experimented with glassing directly to palladium. This introduced a bubble problem caused by the outgassing of hydrogen absorbed by the palladium (a well known property of palladium). The inventors discovered that this problem could be resolved by the use of Pd having a relatively low hydrogen content. As pure Pd may be too soft for certain end use applications, the inventors discovered certain hardening agents could be added to the Pd to increase the hardness and strength without adversely affecting its oxidation and solderability properties. Such hardening agents include other precious metals and especially Ru in amounts up to about 10 wt. %. In addition, parts incorporating Pd or Pd alloy terminals can be glassed in an atmosphere suitable for preventing $H_2$ bubble formation with very acceptable results.

In a preferred embodiment, a typical seal consists of a stainless steel body, glass compatible with the coefficient of expansion of a 5% ruthenium, 95% palladium alloy, and at least one terminal of this alloy.

SUMMARY OF THE INVENTION

The invention provides a glass-to-metal seal comprising a glass member and a metal member consisting essentially of Pd or a Pd-Ru alloy, the glass member being in intimate contact with the metal member and forming a glass-to-metal seal therewith. The Pd-Ru alloy preferably includes 0.5 to 10 wt. % Ru and the Pd-Ru alloy preferably has a coefficient of thermal expansion compatible with a coefficient of thermal expansion of the glass member.

According to one aspect of the invention, an outer body can surround the glass member and form a bonded seal therewith and the metal member passes through the glass to form a glass-to-metal seal therewith. In this case, the metal member can comprise an electrically conductive terminal. The outer body preferably has a coefficient of expansion which is greater than a coefficient of expansion of the glass member. With this construction, the outer body places the interface between the outer body and the glass member under compression and the interface between the glass member and the terminal is also placed under compression.

According to another aspect of the invention, the metal member can comprise a cladding on a metal wire. For instance, the metal wire can comprise a wire of an Fe-Ni alloy and the cladding of the Pd or Pd-Ru alloy can be any suitable thickness which prevents the Pd or Pd-Ru layer from disappearing from the wire (e.g., due to diffusion into the wire) during heating to form the glass-to-metal seal. For instance, the cladding can be 0.003 inch in thickness. The outer body can comprise a cylindrical stainless steel member.

According to another aspect of the invention, a lead wire can be thermocompression bonded to the metal member. For instance, the lead wire can be a gold wire having a diameter no greater than 0.004 inch, the lead wire being directly joined to the metal member by means of a metallurgical bond.

The invention also provides a method of making a glass-to-metal seal comprising the steps of providing a glass member, providing a metal member consisting essentially of an oxidation resistant Pd or Pd alloy, placing a surface of the metal member adjacent to a surface of the glass member, forming a glass-to-metal seal between the metal member and the glass member by placing the metal member and glass member in a furnace heated to a temperature high enough to cause melting of the glass and forming a glass-to-metal seal between the metal member and glass member, providing an atmosphere in the furnace which prevents outgassing of hydrogen from the metal member and removing the metal member and glass member from the furnace after the glass-to-metal seal is formed therebetween.

According to a preferred aspect of the inventive method, the atmosphere includes hydrogen in an amount effective to prevent outgassing of hydrogen from the metal member during the glass-to-metal seal forming step. The Pd or Pd alloy can include hydrogen provided the amount of hydrogen is not so high that outgassing of hydrogen into the metal-glass interface occurs during the glass-to-metal seal forming step. Likewise, the furnace should include enough hydrogen to prevent outgassing of hydrogen from the metal member into the interface during the seal forming step. For instance, the Pd or Pd alloy can be essentially hydrogen-free prior to the glass-to-metal seal forming step and the furnace atmosphere can comprise up to 25% by volume hydrogen with the remainder being an inert gas such as argon or nitrogen.

The method can also include joining a metal lead to the metal member after removal of the metal member from the furnace, the joining step being performed without chemically cleaning and/or plating of the metal member between the removing step and joining step.

According to various aspects of the inventive method, the metal lead can comprise a gold wire and the Pd alloy can comprise a Pd-Ru alloy such as a Pd-Ru alloy containing 4.5 to 5.5% Ru.

According to another feature of the inventive method, it is possible to provide an outer body, arrange the outer body, the glass member and the metal member such that the metal member extends through the glass member and form a seal between the outer body and the glass member during the glass-to-metal seal forming step. Preferably, the outer body comprises an outer metal member having a coefficient of thermal expansion which is greater than a coefficient of thermal expansion of the glass member. The outer metal member preferably is of stainless steel but could comprise another metal, ceramic, or composite material.

DETAILED DESCRIPTION OF THE PREFERRED EMBODIMENTS

Figure 1:
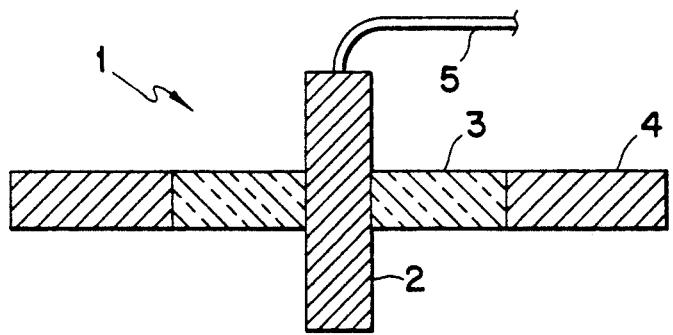
FIG. 1 is a side sectional view of a first embodiment of a glass-to-metal seal in accordance with the invention.

According to the invention, hermetic glass-to-metal seals are provided by glassing directly onto palladium or a palladium alloy. The alloy can include up to 10% Ru and excludes elements which are susceptible to oxidation or contamination of the devices into which the seals are being incorporated. For instance, the alloy can include 5% Ru and the palladium can be a low hydrogen or $H_2$-free palladium. The alloy is difficult to oxidize in typical glass sealing processes and is capable of soldering directly upon emerging from the glass-sealing oven without requiring aqueous cleaning cycles and/or plating. A bubble problem caused by outgassing of hydrogen absorbed by the palladium can be avoided by controlling the hydrogen content in the palladium and by controlling an atmosphere of a furnace used in forming the glass-to-metal seal. The Ru provides hardness to the alloy and can be used to provide a suitable coefficient of expansion compared to that of the glass. The alloys can be glassed in an atmosphere (e.g., a hydrogen containing atmosphere) suitable for preventing $H_2$ bubble formation, i.e., outgassing of hydrogen from the Pd into an interface between the glass and the Pd. The alloy can be used as terminals consisting of the alloy or as a cladding on another metal such as a NiFe wire.

The electronics industry has expressed a need for hermetic headers that are intrinsically clean and easily solderable. The glass-to-metal seals of the invention have been designed to meet this need. According to the invention, headers can be provided which are ready for the next assembly installation immediately after the glass sealing operation. The headers are free of oxide scale and the terminals are solderable in the "as seal" condition. Any contamination associated with acid or alkaline cleaning solutions or plating chemicals is eliminated.

The processes and components used in the manufacture of the glass-to-metal seals of the invention provide high quality, high reliability glass-to-metal seals. The sealing method, which can be performed at temperatures in the range of 800° to 1100° C., in carefully controlled atmospheres, results in the elimination of all volatile organics and other impurities. The terminal is Pd or a Pd alloy such as a Pd-Ru alloy, preferably Pd-4.5 to 5.5 wt % Ru developed specifically for this purpose and the body may be stainless steel, copper, INCONEL (Ni-Cr-Fe), MONEL, HYMU 80, (4% Mo, 80% Ni Fe) or other desirable material. The Pd-5%Ru alloy is preferred because of its linear expansion coefficient over temperatures from room temperature to 650° C.

The headers of the invention have undergone extensive testing to show conformance to many military specifications. For instance, the glass-to-metal seals of the invention have been used successfully in devices operated at extremely low temperatures. In particular, the glass-to-metal seals of the invention can be used for extended periods at temperatures below 77K, the temperature of liquid nitrogen. Various tests and results are as follows:

| TEST | RESULTS |
| --- | --- |
| Hermeticity per MIL-STD-883 C, Method 1014.5 | less than $10^{-10}$ std cc/sec helium |
| Lead Tension per MIL-STD-883 C, Method 2004.4 Cond. A, .040" diameter .070" seal length | $\geq$ 30 lbs for 6 sec. No hermeticity loss. |
| Insulation Resistance per MIL-STD-883 C, Method 1003, 800 VDC | $\geq 10^{10}$ ohm |

-continued

| TEST | RESULTS |
| --- | --- |
| Thermal Shock per MIL-STD-883 C, Method 1011.4, 3 cycles +165° F. to −54° F. | No hermeticity loss or insulation resistance loss. |

Additional testing was conducted to evaluate possible changes in solderability and contact resistance with time and condition. Various tests and results are as follows:

Aged at 172° C. for 11 days in air. No changes in solderability or contact resistance were noted.

Vibrated in benzene for 21 days. No changes in contact resistance were noted. Terminals solderable with RMA type flux accompanied by solder iron wiping.

Steam aged per MIL-STD 202, Method 208 for 8 hours. No solderability or contact resistance changes were noted.

Figure 2:
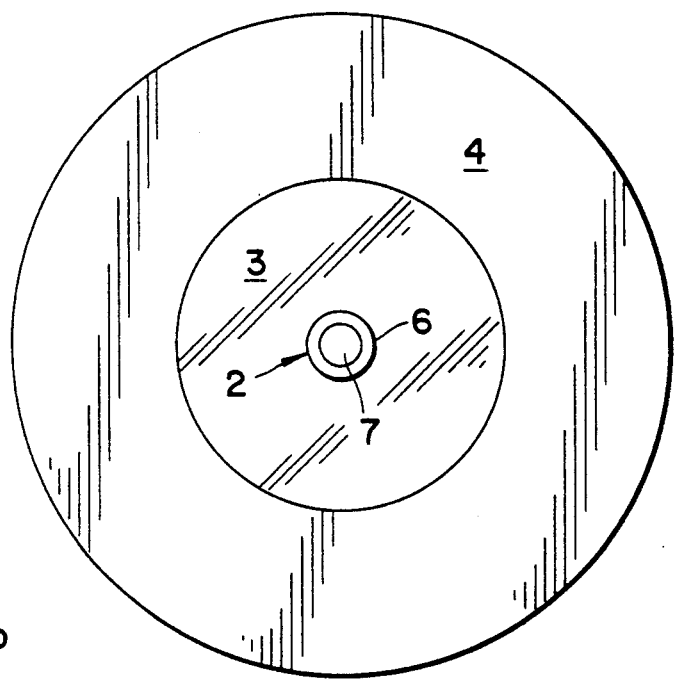
FIG. 2 is a top view of the glass-to-metal seal shown in FIG. 1.

A first embodiment of the invention is shown in FIGS. 1 and 2. In particular, a glass-to-metal seal 1 comprises a metal member 2 and a glass member 3. The glass member 3 can be surrounded by an outer body 4 and, if desired, the metal member 2 can be joined to a lead wire 5. As shown in FIG. 2, the metal member 2 can include a cladding 6 on a wire 7 and the lead wire 5 can be omitted.

Figure 3:
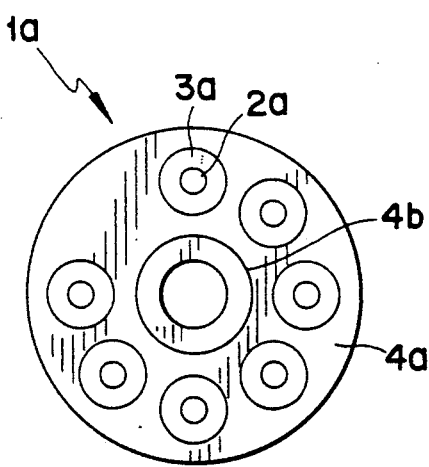
FIG. 3 is a top view of a second embodiment of a glass-to-metal seal in accordance with the invention.

FIG. 3 shows a top view of a second embodiment of a glass-to-metal seal 1a in accordance with the invention. In this case, a cylindrical outer body 4a includes a central fitting 4b for attaching the body 4a to another part. In addition, seven terminals 2a and glass members 3a are concentrically arranged between the fitting 4b and an outer periphery of the body 4a.

Figure 4:
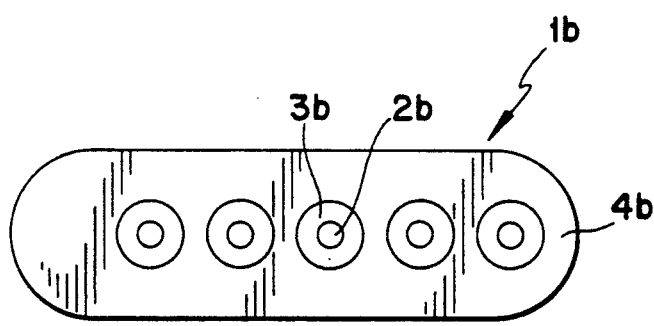
FIG. 4 is a top view of a third embodiment of a glass-to-metal seal in accordance with the invention.

FIG. 4 shows a top view of a third embodiment of a glass-to-metal seal 1b in accordance with the invention. In this case, five terminals 2b and glass members 3b are arranged in a row in an elongated outer body 4b.

Figure 5:
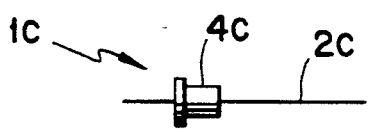
FIG. 5 is a side view of a fourth embodiment of a glass-to-metal seal in accordance with the invention.

FIG. 5 shows a side view of a fourth embodiment of a glass-to-metal seal 1c in accordance with the invention. In this case, a single terminal 2c is sealed in a glass member (not shown) and extends through a generally cylindrical outer body 4c.

In accordance with the invention, the glass member 3 of the glass-to-metal seal 1 can comprise a piece of a glass tube, a washer-shaped cut-out of a glass sheet or a glass preform of powdered glass and binder which has been sintered to remove volatiles and densify the glass preform. For example, the glass member can have a 0.022 inch diameter hole therethrough for receipt of a 0.020 inch diameter terminal 2. The metal member 2 can comprise a wire of Pd or a Pd alloy such as a Pd-Ru alloy or a cladding of Pd or a Pd alloy on a metal wire such as an Fe-Ni alloy.

As shown in FIGS. 1-5, the glass-to-metal seal can be used in various arrangements and have dimensions suited to the particular application. As an example, the outer body 4 can comprise a ⅛" diameter plate having a thickness of ⅛" and a ¼" diameter hole. For high pressure seals, the hole in the outer body 4 can be tapered such that in use pressure pushes the glass against the walls of the tapered hole. The dimensions of the outer body 4 are preferably adjusted to take into account thermal expansion and contraction of the outer body 4, the glass member 3 and the metal member 2. In particular, the outer body 4 should be dimensioned to prevent rupture of the outer body 4 or cracking of the glass member 3 during the glass-to-metal seal forming step. That is, since the body 4 has a higher thermal coefficient of expansion than the glass member 3, the strength of the body 4 should be sufficient to apply compression on the glass member 3 without rupturing the body 4 or cracking the glass member 3. The body 4 can comprise any suitable metal, ceramic or composite materials but preferably is of austenitic stainless steel such as 304L.

The glass-to-metal seal of the invention has been found to be particularly useful for packaging semiconductor components. For instance, in the case of thermocompression bonding gold leads to the metal member 2, not only is it not necessary to chemically clean or gold coat the exposed portions of the metal member 2 after the glass-to-metal seal forming step, but further, the joint formed by thermocompression of the gold wire 5 to the metal member (terminal) 2 is so strong that the gold wire 5 will break before the strength of the joint is exceeded. In addition, if the outer body is an oxidizable metal, it is not necessary to chemically clean the outer body prior to metallurgically bonding the outer body to another component.

The glass-to-metal seal forming step can be performed at temperatures up to 1100° C. The atmosphere in the furnace is controlled to prevent outgassing of hydrogen from the metal member 2 at the interface between the metal member 2 and the glass member 3. A suitable atmosphere comprises an inert gas (such as argon or nitrogen) and enough hydrogen to make the metal member 2 a hydrogen acceptor (rather than a donor) during the seal forming step. For instance, if the initial hydrogen content of the Pd in the metal member 2 is very low or essentially $H_2$-free, the atmosphere can contain 0.5 to 25 vol. % hydrogen. The metal member 2 preferably comprises hydrogen-free Pd or a hydrogen-free Pd-alloy. This allows the metal member 2 to be a net absorber of hydrogen during the glass-to-metal seal forming step. However, the process can also be effective for hydrogen containing Pd or hydrogen containing Pd alloys provided the furnace atmosphere contains sufficient hydrogen to prevent outgassing of hydrogen from the metal member 2 into the interface between the metal member 2 and glass member 3.

EXAMPLE

Several representative glass-to-metal seal headers were cycled between temperatures of +150° C. and −196° C. The header body/terminal materials were KOVAR/KOVAR 304L/ALLOY 52, (52% Ni, Fe) and 304L/Pd-5 wt % Ru.

The cycling procedure was conducted as follows:
Precondition in an oven, at +150° C. for 1 hour.
Transfer quickly to liquid nitrogen. Transfer time is less than 10 seconds. Hold for 5 minutes minimum.
Transfer quickly (<10 seconds) to +150° C. oven. Hold for 5 minutes minimum.
Repeat procedure for a total of 6 cycles.
After the cycling, the headers were visually inspected for cracked glass and then checked for hermeticity. Following this, the KOVAR and 304L was checked for any structural or phase transformations that may have taken place during the cycling.

RESULTS

No glass seal cracks were observed in any of the headers.

All headers indicated hermeticity $>1\times10^{-10}$ std cc/sec; He@1 atm. differential.

Slight metallurgical transformations (i.e., gamma-alpha) were seen on KOVAR only. Any volumetric and thermal expansion changes related to these transformations were insufficient to cause glass seal cracks but further thermal cycling of the KOVAR header may result in failure of the header due to cracking caused by phase changes in the KOVAR material.

CONCLUSIONS

Exposing high quality matched seal type (KOVAR) and compression type (304L) glass-to-metal seal headers to liquid nitrogen temperatures did not compromise the integrity of the seals in any way under the test conditions. However, the KOVAR seal would not be expected to perform as well as the seal of the invention over prolonged test conditions. Accordingly, the headers of the invention perform in a reliable manner but are more economical to manufacture since the conventional acid cleaning operations after formation of the glass-to-metal seal are eliminated. In addition, the elimination of the acid cleaning and plating steps avoids introduction of contaminants into sensitive electronic devices which incorporate the headers.

While the invention has been described with reference to the foregoing embodiments, changes and modifications may be made thereto which fall within the scope of the claims.

What is claimed is:

1. A glass-to-metal seal comprising:
   a glass member;
   a metal member consisting essentially of a Pd-Ru alloy, the glass member being in contact with the metal member and forming a glass-to-metal seal therewith; and
   an outer body surrounding the glass member and forming a seal therewith, the metal member comprising a terminal passing through the glass member.

2. The glass-to-metal seal of claim 1, wherein the Pd-Ru alloy consists essentially of 0.5 to 10 wt. % Ru balance Pd.

3. The glass-to metal seal of claim 1, wherein the outer body has a coefficient of thermal expansion which is greater than a coefficient of thermal expansion of the glass member, the seal between the outer body and the glass member and the glass-to-metal seal between the terminal and the glass member being compression scale.

4. The glass-to-metal seal of claim 1, wherein the glass-to-metal seal forms part of a device which operates at temperatures of 77K and below.

5. The glass-to-metal seal of claim 1, wherein the outer body comprises an outer body of stainless steel.

6. The glass-to-metal seal of claim 1, wherein the Pd-Ru alloy has a coefficient of thermal expansion equal to or slightly higher than a coefficient of thermal expansion of the glass member.

7. The glass-to-metal seal of claim 1, further comprising a lead wire thermocompression bonded to the metal member.

8. The glass-to-metal seal of claim 1, further comprising a gold wire having a diameter of no greater than 0.004 inch joined to the metal member by means of a metallurgical bond.

9. The glass-to-metal seal of claim 8, wherein the bond is capable of withstanding a load greater than an elastic limit of the gold wire.

10. The glass-to-metal seal of claim 1, wherein the glass-to-metal seal forms part of a package for hermetically sealing an integrated circuit.

11. A glass-to-metal seal comprising:
a glass member; and
a metal member consisting essentially of a Pd-Ru alloy, the glass member being in contact with the metal member and forming a glass-to-metal seal therewith, the metal member comprising a cladding on a wire.

12. The glass-to-metal seal of claim 11, wherein the wire comprises a wire of a Fe-Ni alloy and the cladding of the Pd-Ru alloy has a thickness sufficient to prevent the cladding from totally diffusing into the wire during the glass-to-metal seal forming step.

* * * * *